(12) United States Patent
Fratti

(10) Patent No.: US 8,848,831 B2
(45) Date of Patent: Sep. 30, 2014

(54) DIRECT DIGITAL SYNTHESIS OF QUADRATURE MODULATED SIGNALS

(71) Applicant: LSI Corporation, Milpitas, CA (US)

(72) Inventor: Roger A. Fratti, Mohnton, PA (US)

(73) Assignee: LSI Corporation, San Jose, CA (US)

( * ) Notice: Subject to any disclaimer, the term of this patent is extended or adjusted under 35 U.S.C. 154(b) by 97 days.

(21) Appl. No.: 13/623,539

(22) Filed: Sep. 20, 2012

(65) Prior Publication Data

US 2014/0079154 A1   Mar. 20, 2014

(51) Int. Cl.
*H04L 27/36* (2006.01)

(52) U.S. Cl.
USPC .......................................... 375/298; 375/301

(58) Field of Classification Search
USPC .......... 375/298, 300, 301, 307, 308, 320, 322
See application file for complete search history.

(56) References Cited

U.S. PATENT DOCUMENTS

| | | | | |
|---|---|---|---|---|
| 4,167,879 A * | 9/1979 | Pedersen | | 73/610 |
| 4,692,766 A * | 9/1987 | Rolfs et al. | | 342/200 |
| 4,940,950 A * | 7/1990 | Helfrick | | 331/2 |
| 5,184,093 A * | 2/1993 | Itoh et al. | | 331/25 |
| 5,423,076 A * | 6/1995 | Westergren et al. | | 455/86 |
| 5,655,034 A * | 8/1997 | Ishizaka et al. | | 385/3 |
| 5,712,628 A * | 1/1998 | Phillips et al. | | 340/10.51 |
| 5,726,657 A * | 3/1998 | Pergande et al. | | 342/202 |
| 5,732,106 A * | 3/1998 | Rasmussen et al. | | 375/296 |
| 5,732,107 A * | 3/1998 | Phillips et al. | | 375/296 |
| 5,801,589 A * | 9/1998 | Tajima et al. | | 331/1 R |
| 5,822,360 A * | 10/1998 | Lee et al. | | 375/140 |
| 5,822,366 A * | 10/1998 | Rapeli | | 375/219 |
| 5,834,985 A * | 11/1998 | Sundegård | | 332/100 |
| 5,835,985 A * | 11/1998 | Hiyoshi et al. | | 257/121 |
| 5,886,752 A * | 3/1999 | Cross | | 348/724 |
| 5,903,609 A | 5/1999 | Kool et al. | | |
| 5,952,895 A * | 9/1999 | McCune et al. | | 332/128 |
| 6,002,923 A * | 12/1999 | Sahlman | | 455/118 |
| 6,087,865 A * | 7/2000 | Bradley | | 327/117 |
| 6,384,770 B1 * | 5/2002 | de Gouy et al. | | 342/120 |
| 6,906,560 B1 * | 6/2005 | Coleman et al. | | 327/105 |

(Continued)

FOREIGN PATENT DOCUMENTS

WO   99/25104 A1   5/1999

OTHER PUBLICATIONS

"3rd Generation Partnership Project; Technical Specification Group Radio Access Network; Evolved Universal Terrestrial Radio Access (E-UTRA); Physical Channels and Modulation (Release 9)," 3 GPP TS 36.211, V9.1.0, Mar. 2010, 85 pages.

(Continued)

*Primary Examiner* — Emmanuel Bayard

(57) ABSTRACT

An apparatus comprises a direct digital synthesizer, a mixer having first and second input ports and an output port, and a numerically-controlled oscillator. The direct digital synthesizer has a first output coupled to the first input port of the mixer and a second output coupled to a control input of the numerically-controlled oscillator, and the numerically-controlled oscillator has an output coupled to the second input port of the mixer. The mixer provides a quadrature modulated signal at its output port, and the first and second outputs of the direct digital synthesizer control respective portions of the quadrature modulated signal. For example, the first and second outputs of the direct digital synthesizer may control respective amplitude and phase portions of the quadrature modulated signal.

20 Claims, 3 Drawing Sheets

(56) References Cited

U.S. PATENT DOCUMENTS

| | | | |
|---|---|---|---|
| 6,985,043 B2* | 1/2006 | Atsumi et al. | 331/94.1 |
| 7,002,511 B1* | 2/2006 | Ammar et al. | 342/134 |
| 7,095,819 B2* | 8/2006 | Bellaouar et al. | 375/376 |
| 7,215,167 B1* | 5/2007 | Hassun | 327/158 |
| 7,545,224 B2* | 6/2009 | Chow et al. | 331/22 |
| 7,643,802 B2* | 1/2010 | Marsili et al. | 455/114.2 |
| 7,705,773 B2* | 4/2010 | Vacanti | 342/169 |
| 7,773,669 B2* | 8/2010 | Degani et al. | 375/239 |
| 7,805,123 B2* | 9/2010 | Sugiyama et al. | 455/260 |
| 7,889,057 B2* | 2/2011 | Seon | 340/10.2 |
| 7,961,108 B2* | 6/2011 | Klein | 340/572.8 |
| 7,978,789 B2* | 7/2011 | Baker et al. | 375/324 |
| 7,991,074 B2* | 8/2011 | Nentwig | 375/297 |
| 8,188,911 B2* | 5/2012 | Beasley | 342/200 |
| 8,416,124 B2* | 4/2013 | Gerding | 342/124 |
| 2003/0118143 A1* | 6/2003 | Bellaouar et al. | 375/376 |
| 2004/0246060 A1* | 12/2004 | Varis et al. | 332/109 |
| 2005/0068115 A1* | 3/2005 | Atsumi et al. | 331/94.1 |
| 2005/0093584 A1* | 5/2005 | Meacham | 327/105 |
| 2006/0109061 A1* | 5/2006 | Dobson et al. | 332/149 |
| 2006/0140643 A1* | 6/2006 | Way et al. | 398/183 |
| 2007/0041476 A1* | 2/2007 | Seon | 375/340 |
| 2007/0189361 A1* | 8/2007 | Sugiyama et al. | 375/132 |
| 2007/0286308 A1 | 12/2007 | Williams | |
| 2008/0026708 A1* | 1/2008 | Marsili et al. | 455/118 |
| 2008/0064343 A1* | 3/2008 | Lewis | 455/91 |
| 2008/0205541 A1 | 8/2008 | Rofougaran | |
| 2008/0252384 A1* | 10/2008 | Chow et al. | 331/22 |
| 2009/0021319 A1* | 1/2009 | Baker et al. | 332/100 |
| 2009/0041108 A1* | 2/2009 | Degani et al. | 375/238 |
| 2009/0161793 A1* | 6/2009 | Nentwig | 375/297 |
| 2010/0090886 A1* | 4/2010 | Beasley | 342/200 |
| 2010/0109940 A1* | 5/2010 | Williams | 342/171 |
| 2010/0265491 A1* | 10/2010 | McDonald et al. | 356/5.09 |
| 2011/0059704 A1* | 3/2011 | Norimatsu et al. | 455/110 |
| 2011/0227784 A1* | 9/2011 | Beasley et al. | 342/195 |
| 2014/0002287 A1* | 1/2014 | Klepser et al. | 341/144 |
| 2014/0119476 A1* | 5/2014 | Marsili et al. | 375/300 |

OTHER PUBLICATIONS

J. Sommarek et al., "A Digital Quadrature Modulator with On-Chip D/A Converter," 29th European Solid-State Circuits Conference (ESSIRC), Sep. 2003, pp. 85-88.

Jim Stiles, "Mixer Conversion Loss," The University of Kansas, Dept. of EECS, Mar. 2005, 6 pages.

Cotter Sayre "Mixer Design," Complete Wireless Design, Chapter 7, Jun. 2008, pp. 379-401, McGraw-Hill.

* cited by examiner

| BITS | PHASE | AMPLITUDE |
|------|-------|-----------|
| 001  | 45°   | AMP1      |
| 010  | 90°   | AMP2      |
| 100  | 135°  | AMP3      |
| ⋮    | ⋮     | ⋮         |

16-QAM CONSTELLATION

DIRECT DIGITAL SYNTHESIS OF QUADRATURE MODULATED SIGNALS

BACKGROUND

Wireless systems in the cellular context are currently being implemented using fourth generation (4G) standards. These 4G standards include Long Term Evolution (LTE) standards developed by the 3G Partnership Project (3GPP). LTE cellular systems make use of an Internet protocol (IP) based packet core referred to as Evolved Packet Core (EPC). The EPC interconnects multiple base stations within the system. A given base station, also referred to as an evolved Node B (eNB), communicates over an air interface with multiple user terminals. Individual user terminals are also referred to as user equipment (UE).

The air interface between an eNB and UE in an LTE cellular system includes a variety of uplink and downlink channels. See, for example, 3GPP TS 36.211, V9.1.0, 3rd Generation Partnership Project Technical Specification, Group Radio Access Network, Evolved Universal Terrestrial Radio Access (E-UTRA), Physical Channels and Modulation (Release 9), March 2010, which is incorporated by reference herein.

In LTE systems, certain uplink or downlink channels may make use of single-carrier quadrature modulation, such as quadrature phase-shift keyed (QPSK), in which information is conveyed in symbols each comprising one of four distinct phase values, or quadrature amplitude modulation (QAM), in which information is conveyed in symbols each comprising a distinct combination of a phase value and an amplitude value.

Techniques are known in the art for generating various types of modulation signals using direct digital synthesis (DDS). See, for example, PCT International Publication No. WO 99/25104 and U.S. Pat. No. 6,002,923.

However, these conventional techniques can be problematic, particularly in the case of quadrature modulation. For example, techniques such as those described in the above-cited references typically rely on the use of frequency multipliers, which can cause a substantial amount of phase uncertainty in the resulting output signal. Even if the frequency multiplication process begins with a signal having a highly accurate phase, multiplication to increase the frequency will increase the phase variation as well, while also introducing additional phase noise. Moreover, output filtering that is typically used to select a particular multiplied frequency component will introduce additional phase variation as a function of frequency across the filter bandwidth.

The phase uncertainty attributable to use of frequency multiplication in conventional techniques can cause quadrature symbols to rotate into the space of adjacent symbols, leading to sampling errors and a significant reduction in achievable bit error rate (HER) across the output frequency band.

An alternative to use of frequency multipliers is to configure the direct digital synthesis to operate at the desired output frequency. However, this approach is impractical in applications involving high frequencies. In addition, such an approach generally requires the use of separate in-phase (I) and quadrature-phase (Q) channels, each requiring separate components such as mixers, filters and analog-to-digital converters.

SUMMARY

Illustrative embodiments of the invention provide improved techniques for generation of quadrature modulated signals using direct digital synthesis. These techniques may be implemented in a transmitter of a wireless communication system, such as a transmitter in a user terminal or base station of an LTE cellular system, as well as in a wide variety of other communication system applications.

In one embodiment, an apparatus comprises a direct digital synthesizer, a mixer having first and second input ports and an output port, and a numerically-controlled oscillator. The direct digital synthesizer has a first output coupled to the first input port of the mixer and a second output coupled to a control input of the numerically-controlled oscillator, and the numerically-controlled oscillator has an output coupled to the second input port of the mixer. The mixer provides a quadrature modulated signal at its output port, and the first and second outputs of the direct digital synthesizer control respective portions of the quadrature modulated signal. For example, the first and second outputs of the direct digital synthesizer may control respective amplitude and phase portions of the quadrature modulated signal.

The mixer may be configured to operate in a region of operation in which its conversion gain is a substantially linear function of an amplitude control signal received at the first input port from the first output of the direct digital synthesizer. The first input port may comprise a local oscillator port of the mixer, with the region of operation being below a critical local. oscillator drive level of the mixer.

Embodiments of the invention provide considerable improvements relative to the conventional approaches described above. For example, in one or more embodiments, the direct digital synthesis can provide a modulated output signal with highly accurate phase, therefore allowing very low levels of BER to be achieved, while completely avoiding the need for frequency multipliers or separate I and Q channels. As a result, device cost can be significantly reduced.

DETAILED DESCRIPTION

Embodiments of the invention will he illustrated herein in conjunction with exemplary wireless communication systems which include one or more base stations each configured to communicate with multiple user terminals in a particular manner. It should be understood, however, that the disclosed techniques are more generally applicable to any communication system application in which it is desirable to provide improved generation of quadrature modulated signals using direct digital synthesis. For example, embodiments of the invention can be implemented in a wide variety of other types of wireless communication systems, including systems outside of the LTE cellular context, such as WiMAX systems, Wi-Fi systems. etc. Also. the disclosed techniques can also be used in wired communication systems, such as DSL systems.

Figure 1:
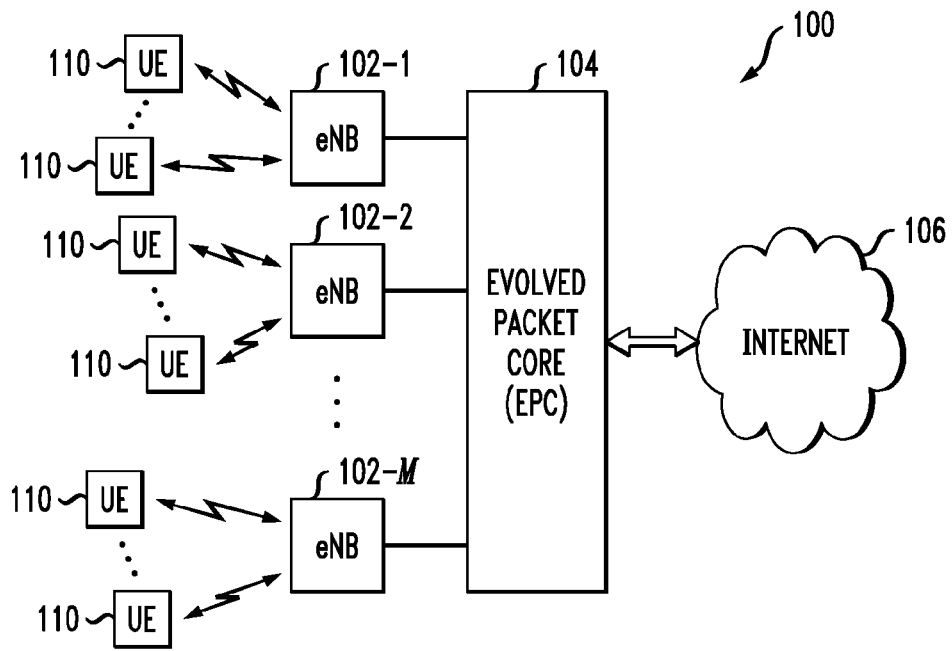
FIG. 1 is a block diagram showing an illustrative embodiment of a wireless communication system that incorporates at least one transmitter configured for direct digital synthesis of quadrature modulation.

FIG. 1 shows a wireless communication system 100 in an illustrative embodiment. The system 100 includes a plurality of base stations 102-1, 102-2 . . . 102-M, each arranged to communicate with multiple user terminals 110. It is assumed without limitation that the wireless system 100 comprises an LTE cellular system. The base stations 102 are therefore also referred to in this embodiment as respective evolved Node B (eNB) elements, and the user terminals 110 are also referred to as user equipment (UE). The base stations 102 are coupled to an evolved packet core (EPC) 104, which may include, for example, one or more conventional gateways and mobility management entities of a type well known in the art. The EPC 104 provides connectivity between the base stations 102 and one or more external networks, in this embodiment illustratively comprising Internet 106.

A given one of the user terminals 110 may comprise, by way of example, a mobile telephone, a computer, or any other type of user communication device. The term "user terminal" as used herein is therefore intended to be construed broadly, so as to encompass a variety of different types of mobile stations, subscriber stations or, more generally, communication devices.

The base stations 102 and user terminals 110 in the system 100 communicate over uplink and downlink channels of the type specified in the 3GPP LTE standards documents, such as the above-cited 3GPP TS 36.211 document. For one or more channels. such communication is assumed to involve use of quadrature modulation, such as QPSK or QAM modulation. As will be described in greater detail below, the present embodiment comprises one or more transmitters in which quadrature modulated signals are generated using direct digital synthesis. Such transmitters may comprise base station transmitters and user terminal transmitters. in any combination.

The system 100 as illustrated in FIG. 1 is just one exemplary configuration of a communication system that may incorporate direct digital synthesis of quadrature modulated signals using the techniques disclosed herein, and numerous alternative configurations of system elements may be used in other embodiments. For example, other embodiments of the invention may include additional or alternative elements of a type commonly associated with conventional system implementations.

Figure 2:
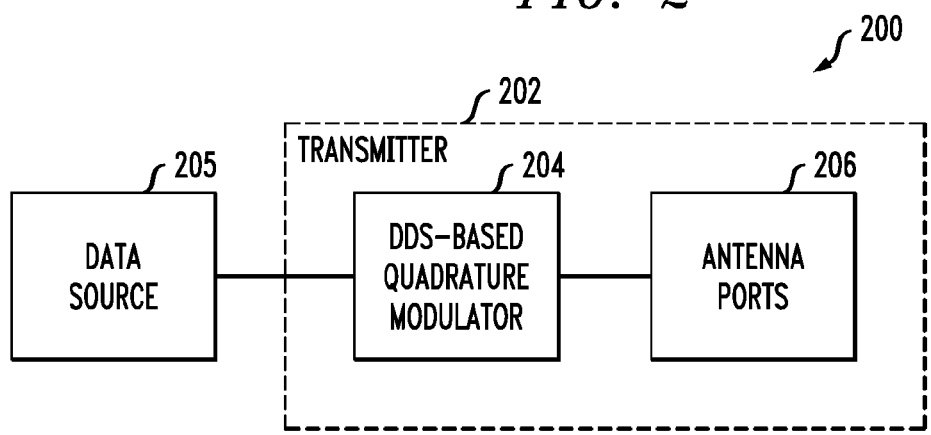
FIG. 2 shows a portion of a base station of the FIG. 1 system including a transmitter.

FIG. 2 shows a portion 200 of a particular one of the base stations 102-1 with the portion 200 including a transmitter 202. The transmitter 202 comprises a DDS-based quadrature modulator 204, where DDS in this particular context denotes direct digital synthesis, but elsewhere herein may also refer to a direct digital synthesizer. The quadrature modulator 204 receives at least one data stream from a data source 205 illustratively shown as being external to the transmitter 202 in this embodiment, although one or more data sources internal to the transmitter 202 could be used in other embodiments. As another example, a combination of internal and external data sources may be used to provide one or more data streams to the quadrature modulator 204. The quadrature modulator 204 generates one or more quadrature modulated signals for transmission via antenna ports 206.

It is to be appreciated that the diagram of FIG. 2 is simplified for purposes of illustration, and a variety of other types of additional or alternative transmitter components and other related transmission equipment may be incorporated into transmitter 202 as required to satisfy communication protocols associated with a given embodiment. Conventional aspects of such transmission equipment are well understood to those skilled in the art and therefore not described in detail herein.

Also, the transmitter 202 may comprise a processor coupled to a memory, although such components are not explicitly shown in the figure. At least a portion of the functionality of the transmitter 202 may be implemented as one or more processing modules, each comprising computer program code that is stored in the memory and executed by the processor. The processor and memory elements of the transmitter 202 need not be dedicated exclusively to the transmitter 202 and accordingly may be shared with one or more other transmitters, receivers or other components of the base station 102-1. For example, these processor and memory elements may represent respective generalized processing and memory resources of the base station that perform operations for multiple base station components.

A given processor implemented in or otherwise associated with transmitter 202 may comprise, for example, one or more microprocessors, application-specific integrated circuits (ASICs), field-programmable gate arrays (FPGAs), digital signal processors (DSPs), systems-on-chip (SOCs) or other types of processing devices, as well as portions or combinations of such elements. The corresponding memory may comprise, for example, electronic memory such as random access memory (RAM) or read-only memory (ROM), magnetic memory. optical memory or other types of storage elements, as well as portions or combinations of such elements. System memory elements of this type are considered examples of what are also referred to herein as computer-readable storage media that store computer program code, or more generally computer program products having executable program code embodied therein. Such program code when executed in the base station 102-1 of the communication system 100 causes the transmitter 202 to perform DDS-based generation of quadrature modulated signals in the manner disclosed herein.

Figures 3, 4:
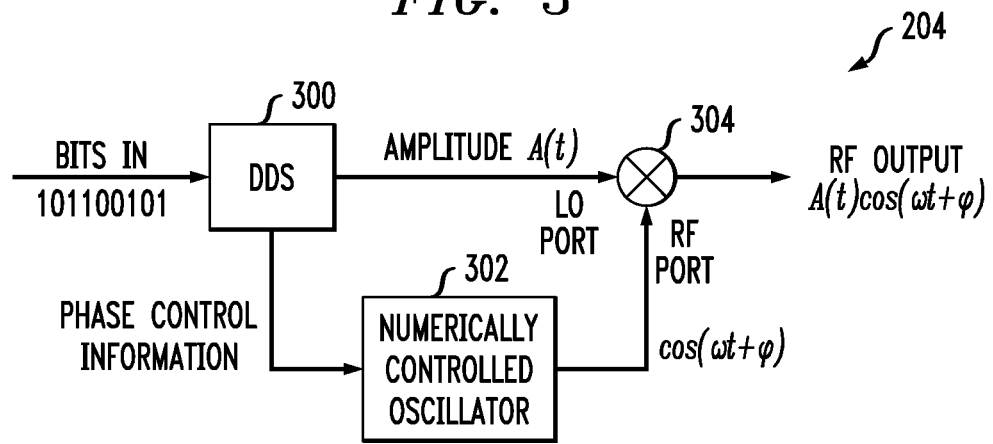
FIG. 3 shows an illustrative embodiment of a quadrature modulator that may he implemented in the transmitter of FIG. 2.
FIG. 4 shows an example of a look-up table implemented in a direct digital synthesizer of the quadrature modulator of FIG. 3.

Referring now to FIG. 3, an illustrative embodiment of the quadrature modulator 204 is shown in greater detail. The quadrature modulator 204 in this embodiment comprises a direct digital synthesizer 300, a numerically-controlled oscillator 302, and a mixer 304 having first and second input ports and an output port. The first and second input ports of the mixer 304 are more particularly denoted in this embodiment as a local oscillator (LO) port and a radio frequency (RF) port, respectively. However, other designations of first and second mixer input ports may be used in other embodiments.

The direct digital synthesizer 300 receives a data stream comprising a sequence of input bits from the data source 205. The direct digital synthesizer 300 has a first output coupled to the LO port of the mixer 304 and a second output coupled to a control input of the numerically-controlled oscillator 302. The numerically-controlled oscillator 302 has an output coupled to the RF port of the mixer 304. The mixer 304 is configured to provide a quadrature modulated signal at its output port.

The first and second outputs of the direct digital synthesizer 300 control respective portions of the quadrature modulated signal generated by mixer 304. More particularly, in the present embodiment, the first and second outputs of the direct digital synthesizer 300 control respective amplitude and phase portions of the quadrature modulated signal. The direct digital synthesizer 300 is thus configured to generate at its first output an amplitude control signal $A(t)$ for application to the LO port of the mixer 304 for controlling an amplitude portion of the quadrature modulated signal. In addition, the direct digital synthesizer 300 is configured to generate at its second output a phase control signal for application to the control input of the numerically-controlled oscillator 302 for controlling a phase portion of the quadrature modulated signal. The phase control signal is more particularly identified in the figure as comprising phase control information.

In the FIG. 3 embodiment, the mixer 304 is configured to operate in a region of operation in which its conversion gain is a substantially linear function of the amplitude control signal A(t) received at the LO port from the first output of the direct digital synthesizer 300. More particularly, the region of operation is below a critical LO drive level of the mixer. This is unlike common conventional usage of a mixer, where the LO port is typically driven well above the critical drive level in order to minimize variation in the conversion gain as a function of drive level. Accordingly, in the present embodiment the mixer 304 is deliberately configured to have a variable conversion gain, so as to permit particularly efficient generation of a quadrature modulated signal at the mixer output.

The mixer 304 can be an otherwise conventional mixer, albeit with an adjusted LO drive level as described previously, Any of a wide variety of different mixer designs known in the art can be used, including, for example, a mixer comprising multiple series diodes in each leg of a quad diode ring, or a mixer based on a Gilbert cell or even simpler single-ended bipolar or MOSFET arrangements.

The output of the numerically-controlled oscillator 302 provides a phase control signal $\cos(\omega t + \phi)$, and the mixer 304 provides at its output port an RF output comprising quadrature modulated signal $A(t)\cos(\omega t + \phi)$. Although not illustrated in the figure, appropriate filtering may be provided at the mixer output.

The direct digital synthesizer 300 may utilize a look-up table 400 of the type shown in FIG. 4 to convert groups of input bits to respective symbols each having a distinct combination of a phase value and an amplitude value. Thus, for example, a group of bits 001 is mapped to a symbol having a phase value of 45° and an amplitude value denoted AMP1. Similarly, groups of bits 010 and 100 are mapped to symbols having respective phase values of 90° and 135° and respective amplitude values denoted AMP2 and AMP3. Other groups of bits are mapped to phase and amplitude values in a similar manner. The look-up table 400 may be stored in a memory of the transmitter 202 or its associated base station 102-1, which may comprise ROM or other types of memory.

Figure 5:
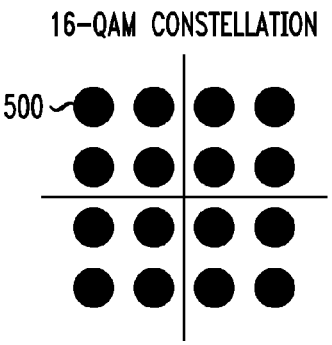
FIG. 5 shows an example of a 16-QAM modulation constellation generated using the quadrature modulator of FIG. 3.

Mapping operations performed in the manner illustrated in FIG. 4 can be used to produce a quadrature modulated signal at the output of mixer 304 that has a modulation constellation of the type shown in FIG. 5. Each of the symbols 500 in the constellation has a distinct combination of a phase value and an amplitude value. This particular constellation is a 16-QAM constellation, and so the associated mapping involves mapping each unique group of 4 bits to one of $2^4=16$ unique amplitude-phase pairs, where each amplitude-phase pair corresponds to a particular symbol of the modulation constellation. As the 16-QAM constellation illustrated in FIG. 5 involves mapping of 4-bit groups, it does not correspond directly to the 3-bit group mapping example of FIG. 3. The latter arrangement would be used to produce an 8-QAM constellation. These and a wide variety of other QAM or QPSK quadrature modulated signals may be generated by quadrature modulator 204.

Figure 6:
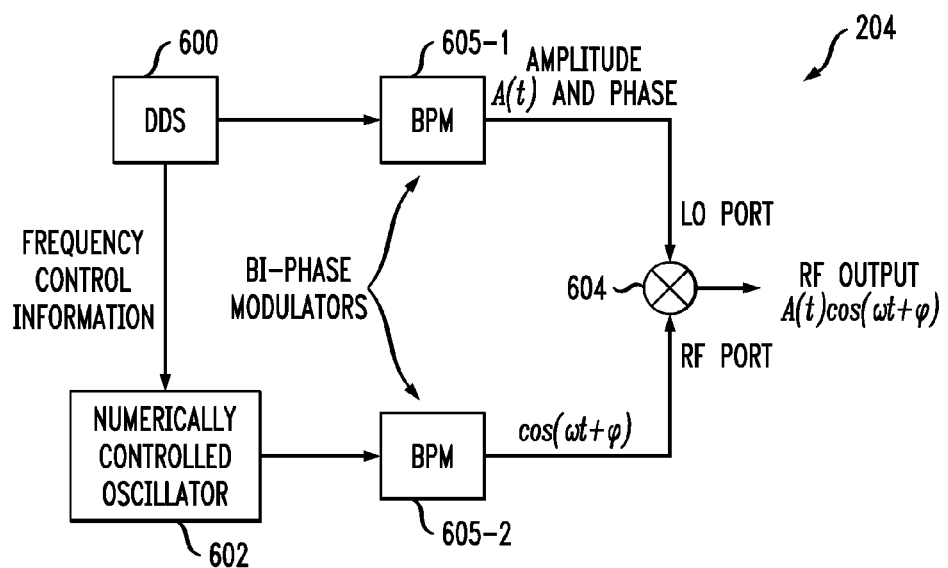
FIG. 6 shows another illustrative embodiment of a quadrature modulator that may be implemented in the transmitter of FIG, 2.

With reference now to FIG. 6, another illustrative embodiment of the quadrature modulator 204 is shown. In this embodiment, the quadrature modulator 204 comprises a direct digital synthesizer 600, a numerically-controlled oscillator 602 and a mixer 604, which correspond generally to similar elements 300, 302 and 304, respectively, of the FIG. 3 embodiment, and operate in a similar manner. However, in the present embodiment, the direct digital synthesizer 600 is configured to generate at its second output a frequency control signal for application to the control input of the numerically-controlled oscillator 602. The frequency control signal is more particularly identified in the figure as comprising frequency control information.

The quadrature modulator 204 as shown in FIG. 6 further comprises a first phase modulation element 605-1 coupled between the first output of the direct digital synthesizer 600 and the LO port of the mixer 604, and a second phase modulation element 605-2 coupled between the output of the numerically-controlled oscillator 602 and the RF port of the mixer 604. The first and second phase modulation elements 605 are configured to control the phase portion of the quadrature modulated signal, and in this embodiment more particularly comprise respective bi-phase modulators (BPMs), although other types of phase modulation elements may be used in other embodiments, The FIG. 6 embodiment controls only the frequency and not the phase of the numerically-controlled oscillator 602. The phase is controlled using the two BPMs 605-1 and 605-2.

Although not expressly illustrated in FIG. 6, a fixed phase shifter may be arranged in series with one of the first and second phase modulation elements 605. For example, using two BPMs without an additional fixed phase shifter, their respective output signals will have phase values of either 0° or 180° and can also have different amplitudes. Such an arrangement can be used to generate a multi-level quadrature modulated signal. However, by introducing a 90° fixed phase shifter before or after one of the BPMs, a full QAM signal can be generated. Accordingly, one or more fixed phase shifters may be incorporated into the FIG. 6 embodiment, as will be appreciated by those skilled in the art.

As in the FIG. 3 embodiment, the output of the numerically-controlled oscillator 602 in the quadrature modulator 204 of the FIG. 6 embodiment provides a phase control signal $\cos(\omega t + \phi)$, and the mixer 604 provides at its output port an RF output comprising quadrature modulated signal $A(t)\cos(\omega t + \phi)$.

The illustrative embodiments of FIGS. 3 and 6 provide considerable improvements relative to conventional practice. For example, the use of direct digital synthesis can provide a modulated output signal with highly accurate phase, therefore allowing very low levels of BER to be achieved, while completely avoiding the need for frequency multipliers or separate I and Q channels. As a result, device cost can be significantly reduced. Also, integration of the quadrature modulator into a high-speed integrated circuit is considerably facilitated.

The particular circuitry and processing module arrangements shown in FIGS. 3 and 6 may be varied in other embodiments. Numerous alternative arrangements of hardware. software and firmware in any combination may be used to implement the described generation of quadrature modulated signals by direct digital synthesis.

Quadrature modulators or portions thereof in accordance with embodiments of the invention may be implemented in the form of one or more integrated circuits suitable for installation within base stations, user terminals or other communication equipment. Thus, quadrature modulator 204 and its direct digital synthesizer, numerically-controlled oscillator, mixer and possibly other components may be implemented in the form of an integrated circuit, or as a combination of multiple integrated circuits.

The term "transmitter" as used herein is intended to be broadly construed, so as to encompass, for example, at least one quadrature modulator and one or more related elements such as signal generators, upconverters, filters, antennas, etc. A base station transmitter may therefore be implemented in the form of an integrated circuit.

In a given integrated circuit implementation, identical die are typically formed in a repeated pattern on a surface of a semiconductor wafer. Each die may include at least a portion of a quadrature modulator as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of the invention.

It should once again be emphasized that the embodiments described herein are intended to be illustrative only. For example, the particular arrangement of base stations, user terminals, networks and other system elements as shown in FIG. 1 may be varied in alternative embodiments. Also, other types of circuitry elements or processing modules may be used to implement generation of quadrature modulated signals by direct digital synthesis as disclosed herein. These and numerous other alternative embodiments within the scope of the following claims will be readily apparent to those skilled in the art.

What is claimed is:

1. An apparatus comprising:
   a direct digital synthesizer;
   a mixer having first and second input ports and an output port, said mixer comprising a single-channel mixer without separate in-phase and quadrature channels; and
   a numerically-controlled oscillator;
   the direct digital synthesizer having a first output coupled to the first input port of the mixer and a second output coupled to a control input of the numerically-controlled oscillator;
   the numerically-controlled oscillator having an output coupled to the second input port of the mixer;
   wherein the mixer provides a quadrature modulated signal at its output port; and
   wherein the first and second outputs of the direct digital synthesizer control respective portions of the quadrature modulated signal.

2. The apparatus of claim 1 wherein the first and second outputs of the direct digital synthesizer control respective amplitude and phase portions of the quadrature modulated signal.

3. The apparatus of claim 1 wherein the direct digital synthesizer is configured to generate at its first output an amplitude control signal for application to the first input port of the mixer for controlling an amplitude portion of the quadrature modulated signal.

4. The apparatus of claim 1 wherein the direct digital synthesizer is configured to generate at its second output a phase control signal for application to the control input of the numerically-controlled oscillator for controlling a phase portion of the quadrature modulated signal.

5. The apparatus of claim 1 wherein the direct digital synthesizer is configured to generate at its second output a frequency control signal for application to the control input of the numerically-controlled oscillator.

6. The apparatus of claim 5 further comprising:
   a first phase modulation element coupled between the first output of the direct digital synthesizer and the first input port of the mixer; and
   a second phase modulation element coupled between the output of the numerically-controlled oscillator and the second input port of the mixer;
   wherein the first and second phase modulation elements are configured to control a phase portion of the quadrature modulated signal.

7. The apparatus of claim 6 wherein the first and second phase modulation elements comprise respective bi-phase modulators.

8. The apparatus of claim 6 further comprising a fixed phase shifter arranged in series with one of the first and second phase modulation elements.

9. The apparatus of claim 1 wherein the mixer is configured to operate in a region of operation in which its conversion gain is a substantially linear function of an amplitude control signal received at the first input port from the first output of the direct digital synthesizer.

10. The apparatus of claim 9 wherein the region of operation is below a critical local oscillator drive level of the mixer.

11. The apparatus of claim 1 wherein the first input port of the mixer comprises a local oscillator port of the mixer.

12. A transmitter comprising the apparatus of claim 1.

13. A communication system base station comprising the transmitter of claim 12.

14. A method comprising:
    generating a quadrature modulated signal at an output port of a mixer, said mixer comprising a single-channel mixer without separate in-phase and quadrature channels; and
    controlling portions of the quadrature modulated signal using respective first and second outputs of a direct digital synthesizer;
    wherein the first output of the direct digital synthesizer is coupled to a first input port of the mixer, the second output of the direct digital synthesizer is coupled to a control input of a numerically-controlled oscillator, and an output of the numerically-controlled oscillator is coupled to a second input port of the mixer.

15. The method of claim 14 wherein controlling portions of the quadrature modulated signal comprises:
    generating at the first output of the direct digital synthesizer an amplitude control signal for application to the first input port of the mixer for controlling an amplitude portion of the quadrature modulated signal; and
    generating at the second output of the direct digital synthesizer a phase control signal for application to the control input of the numerically-controlled oscillator for controlling a phase portion of the quadrature modulated signal.

16. The method of claim 14 wherein controlling portions of the quadrature modulated signal comprises:
    generating at the first output of the direct digital synthesizer an amplitude control signal for application to the first input port of the mixer for controlling an amplitude portion of the quadrature modulated signal;
    generating at the second output of the direct digital synthesizer a frequency control signal for application to the control input of the numerically-controlled oscillator; and
    controlling a phase portion of the quadrature modulated signal utilizing a first phase modulation element coupled between the first output of the direct digital synthesizer and the first input port of the mixer, and a second phase modulation element coupled between the output of the numerically-controlled oscillator and the second input port of the mixer.

17. The method of claim 14 further comprising operating the mixer in a region of operation in which its conversion gain is a substantially linear function of an amplitude control signal received at the first input port from the first output of the direct digital synthesizer.

18. The method of claim 17 wherein the region of operation is below a critical local oscillator drive level of the mixer.

19. The method of claim 14 wherein the first input port of the mixer comprises a local oscillator port of the mixer.

20. A computer program product comprising a storage medium having executable computer program code embodied therein, wherein the computer program code when executed in a transmitter causes the transmitter:
   to generate a quadrature modulated signal at an output port of a mixer, said mixer comprising a single-channel mixer without separate in-chase and quadrature channels; and
   to control portions of the quadrature modulated signal using respective first and second outputs of a direct digital synthesizer;
   wherein the first output of the direct digital synthesizer is coupled to a first input port of the mixer, the second output of the direct digital synthesizer is coupled to a control input of a numerically-controlled oscillator, and an output of the numerically-controlled oscillator is coupled to a second input port of the mixer.

* * * * *